(12) United States Patent
Park et al.

(10) Patent No.: US 12,020,765 B2
(45) Date of Patent: Jun. 25, 2024

(54) NON-VOLATILE MEMORY PACKAGE AND STORAGE DEVICE COMPRISING THE SAME

(71) Applicant: SAMSUNG ELECTRONICS CO., LTD., Suwon-si (KR)

(72) Inventors: Ji Woon Park, Suwon-si (KR); Joon Ki Paek, Hwaseong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 305 days.

(21) Appl. No.: 17/409,154

(22) Filed: Aug. 23, 2021

(65) Prior Publication Data
US 2022/0076712 A1 Mar. 10, 2022

(30) Foreign Application Priority Data

Sep. 4, 2020 (KR) .................. 10-2020-0112851

(51) Int. Cl.
| | |
|---|---|
| *G11C 5/06* | (2006.01) |
| *H01L 23/498* | (2006.01) |
| *H01L 23/538* | (2006.01) |
| *H01L 25/065* | (2023.01) |
| *H10B 41/10* | (2023.01) |
| *H10B 41/27* | (2023.01) |
| *H10B 41/35* | (2023.01) |
| *H10B 43/10* | (2023.01) |
| *H10B 43/27* | (2023.01) |
| *H10B 43/35* | (2023.01) |
| *H10B 80/00* | (2023.01) |

(52) U.S. Cl.
CPC .......... *G11C 5/06* (2013.01); *H01L 23/49816* (2013.01); *H01L 23/5386* (2013.01); *H01L 25/0652* (2013.01); *H01L 25/0657* (2013.01); *H10B 41/10* (2023.02); *H10B 41/27* (2023.02); *H10B 41/35* (2023.02); *H10B 43/10* (2023.02); *H10B 43/27* (2023.02); *H10B 43/35* (2023.02); *H10B 80/00* (2023.02); *H01L 2225/06506* (2013.01); *H01L 2225/06562* (2013.01)

(58) Field of Classification Search
CPC ............. H01L 25/0652; H01L 25/0657; H01L 2225/06506; H01L 2225/06562; H10B 80/00
See application file for complete search history.

(56) References Cited

U.S. PATENT DOCUMENTS 9,165,897 B2   10/2015 Lee
9,496,216 B2   11/2016 Chun et al.
(Continued)

FOREIGN PATENT DOCUMENTS

KR   10-2020-0043716 A   4/2020

OTHER PUBLICATIONS

Communication issued Jan. 19, 2022 by the European Patent Office in EP Application No. 21193108.4.
(Continued)

*Primary Examiner* — Yara B Green
*Assistant Examiner* — Fakeha Sehar
(74) *Attorney, Agent, or Firm* — Sughrue Mion, PLLC

(57) ABSTRACT

Provided is a non-volatile memory package that is electrically optimized with a plurality of different non-volatile memory chips through a ball map, by fixing positions of buffer chips connected to the plurality of different non-volatile memory chips.

20 Claims, 14 Drawing Sheets

(56) References Cited

U.S. PATENT DOCUMENTS

| | | |
|---|---|---|
| 10,096,577 B2 | 10/2018 | Kim et al. |
| 10,522,506 B2 | 12/2019 | Kim et al. |
| 2010/0195364 A1 | 8/2010 | Riho |
| 2013/0070507 A1 | 3/2013 | Yoon |
| 2013/0119542 A1 | 5/2013 | Oh |
| 2014/0362648 A1* | 12/2014 | Hwang ................ G06F 3/0688 365/185.18 |
| 2017/0288634 A1 | 10/2017 | Kang et al. |
| 2018/0166105 A1 | 6/2018 | Choi et al. |
| 2019/0206840 A1 | 7/2019 | Lee et al. |
| 2019/0237431 A1 | 8/2019 | Kim |
| 2020/0126919 A1* | 4/2020 | Kang ..................... H01L 23/16 |
| 2020/0272560 A1 | 8/2020 | Keeth et al. |
| 2021/0200699 A1* | 7/2021 | Keeth ................ H01L 25/0657 |

OTHER PUBLICATIONS

Communication issued Jan. 7, 2022 by the European Patent Office in EP Application No. 21193108.4.

* cited by examiner

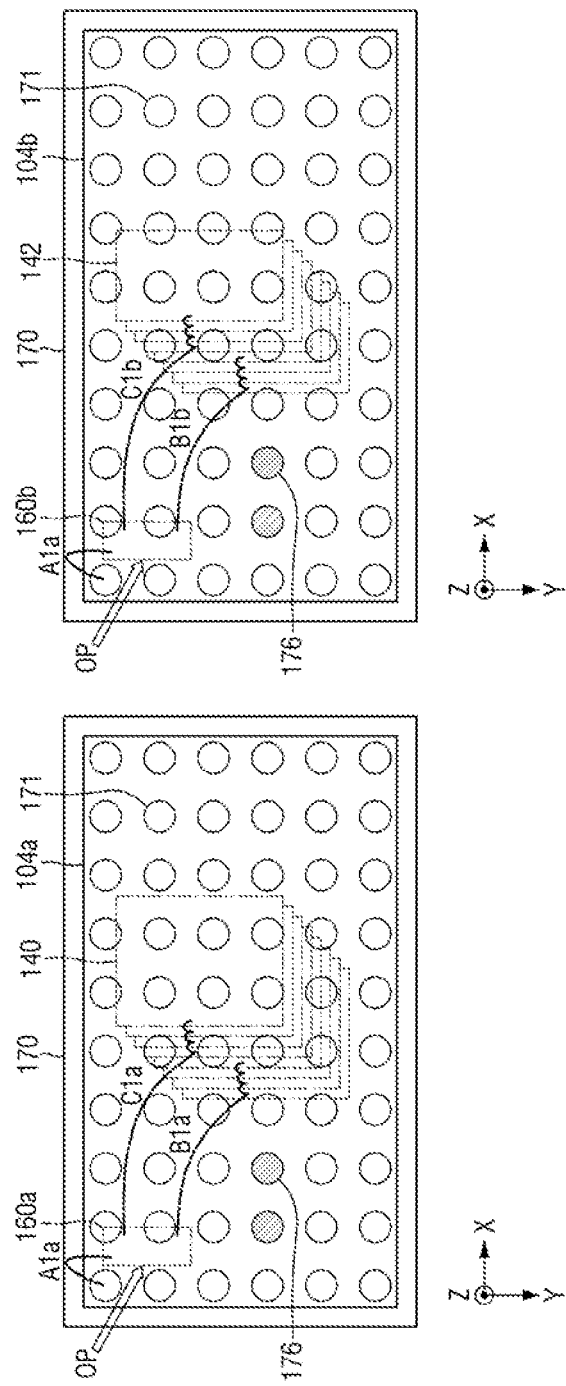

NON-VOLATILE MEMORY PACKAGE AND STORAGE DEVICE COMPRISING THE SAME

CROSS-REFERENCE TO RELATED APPLICATION

This application claims priority from Korean Patent Application No. 10-2020-0112851 filed on Sep. 4, 2020 in the Korean Intellectual Property Office, the contents of which are incorporated by reference herein in its entirety.

BACKGROUND

1. Field

The present disclosure relates to a non-volatile memory package and a storage device including the same.

2. Description of Related Art

Magnetic disks have traditionally been used as data storage devices for electronic systems such as computer systems. However, with the development of semiconductor technology, a storage device such as a solid state drive (SSD) device in which a non-volatile memory such as a flash memory (for example, a NAND-type flash memory) instead of magnetic disk is used as a data storage device in computer systems and portable devices is increasingly being used.

The storage device generally includes a plurality of non-volatile memory chips, but the plurality of non-volatile memory chips may have different capacities and sizes from each other. Therefore, package ball maps optimized for each of the plurality of non-volatile memory chips may be different from each other. That is, there is a need for placement of a chip that may be optimized for all of the plurality of different non-volatile memory chips through a single package ball map.

SUMMARY

One or more example embodiments provide a non-volatile memory package that may be electrically optimized with a plurality of different non-volatile memory chips through a single package ball map, by fixing positions of buffer chips connected to the plurality of different non-volatile memory chips.

One or more example embodiments also provide a storage device including a non-volatile memory package that may be electrically optimized with a plurality of different non-volatile memory chips through a single package ball map, by fixing positions of buffer chips connected to the plurality of different non-volatile memory chips.

According to an aspect of an example embodiment, there is provided a non-volatile memory package including: a first substrate having a first position at which an I/O pad is provided on a lower side of the first substrate, and a second position at which a first buffer chip connected to the I/O pad is provided on an upper side of the first substrate opposing the lower side, wherein the second position of the first substrate is spaced apart from a first edge of the first substrate by an interval; a second substrate having a same size and a same shape as the first substrate, the second substrate having a second position that is spaced apart from a second edge of the second substrate by the interval; a plurality of first non-volatile memory chips placed on the first substrate; the first buffer chip provided at the second position of the first substrate and connected to the plurality of first non-volatile memory chips; a plurality of second non-volatile memory chips placed on the second substrate, each of plurality of second non-volatile memory chips having a second size that is different from a first size of each of the plurality of first non-volatile memory chips; and a second buffer chip provided at the second position of the second substrate and connected to the plurality of second non-volatile memory chips.

According to an aspect of an example embodiment, there is provided a non-volatile memory package including: a first substrate and a second substrate on which I/O pads are respectively provided based on a ball map on which a position of the I/O pads is indicated; a plurality of first non-volatile memory chips provided on the first substrate; a first buffer chip provided at a first position on the first substrate and connected to the plurality of first non-volatile memory chips; a plurality of second non-volatile memory chips provided on the second substrate, each of plurality of second non-volatile memory chips having a second size that is different from a first size of each of the plurality of first non-volatile memory chips; and a second buffer chip provided at a second position on the second substrate that corresponds to the first position on the first substrate, the second buffer chip being connected to the second plurality of non-volatile memory chips.

According to an aspect of an example embodiment, there is provided a storage device including: a controller configured to send and receive data through a plurality of channels; and a plurality of non-volatile memory packages connected to the plurality of channels, wherein at least a part of the plurality of non-volatile memory packages includes: a first substrate having a first position at which a first I/O pad is provided on a lower side of the first substrate, and a second position at which a first buffer chip connected to the first I/O pad is provided on an upper side of the first substrate opposing the lower side of the first substrate; a second substrate having a first position at which a second I/O pad is provided on a lower side of the second substrate and a second position at which a second buffer chip connected to the second I/O pad is provided on an upper side of the second substrate opposing the lower side of the second substrate, the first position of the second substrate corresponding to the first position of the first substrate and the second position of the second substrate corresponding to the second position of the first substrate; a plurality of first non-volatile memory chips provided on the first substrate; the first buffer chip provided at the second position of the first substrate and connected to the plurality of first non-volatile memory chips; a plurality of second non-volatile memory chips provided on the second substrate, each of plurality of second non-volatile memory chips having a size that different from a size of each of the plurality of first non-volatile memory chips; and the second buffer chip provided at the second position of the second substrate and connected to the plurality of second non-volatile memory chips.

BRIEF DESCRIPTION OF THE DRAWINGS

The above and other aspects and features of the present disclosure will become more apparent by describing in detail example embodiments thereof with reference to the attached drawings, in which:

FIG. 5B is a bottom view of an example of the non-volatile memory package of FIG. 5A;

DETAILED DESCRIPTION

Figure 1:
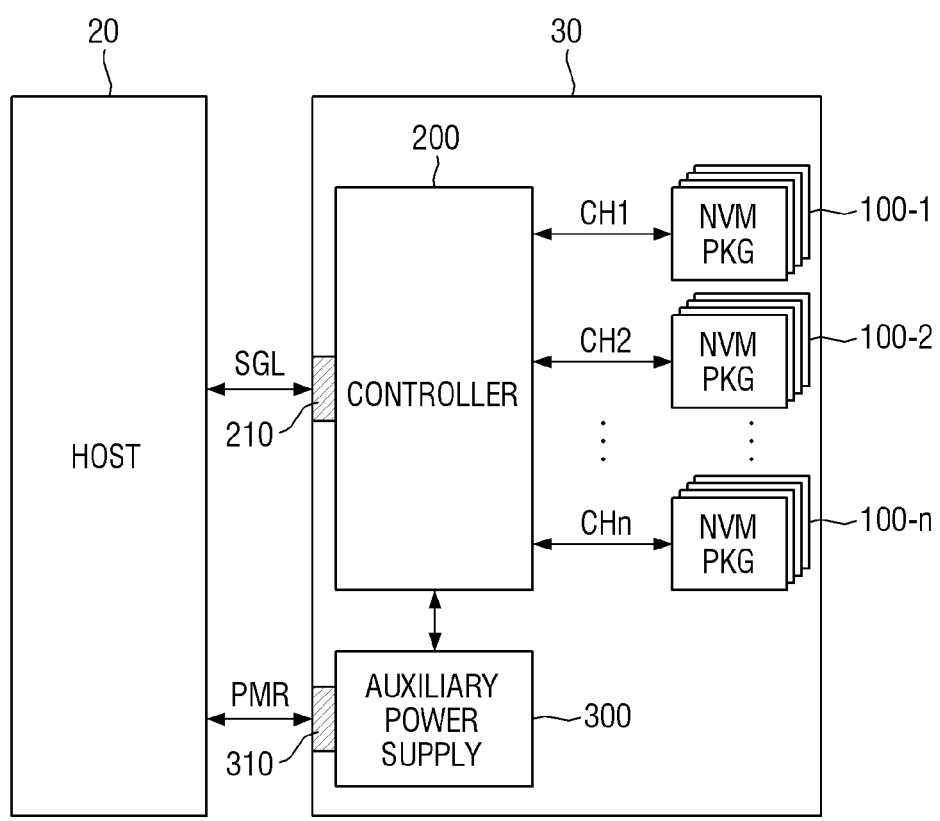
FIG. 1 is a block diagram showing a storage system including a non-volatile memory package according to some example embodiments.

FIG. 1 is a block diagram showing a storage system including a non-volatile memory package according to some example embodiments.

Referring to FIG. 1, a storage system 10 including non-volatile memory packages 100-1, 100-2, . . . , 100-n according to some example embodiments includes a host 20 and a storage device 30. A non-volatile memory package may be referred to herein as "NVM PKG."

The storage device 30 may include a plurality of non-volatile memory packages 100-1 to 100-n including a first non-volatile memory package 100-1 to an nth non-volatile memory package 100-n according to some example embodiments. The plurality of non-volatile memory packages may be used as a storage medium of the storage device 30.

Each of the plurality of non-volatile memory packages 100-1 to 100-n according to some example embodiments may include a plurality of non-volatile memory chips. Each of the plurality of non-volatile memory chips may include a flash memory device. Or, for example, a plurality of non-volatile memory chips may be a NAND flash memory, a vertical NAND flash memory (VNAND), a NOR flash memory, a resistive random access memory (RRAM), a phase-change memory (PRAM), a magnetoresistive random access memory (MRAM), a ferroelectric random access memory (FRAM), a spin injection magnetization inversion memory (STT-RAM) and the like. Also, a plurality of non-volatile memory chips placed in each of the plurality of non-volatile memory packages 100-1 to 100-n according to some example embodiments may include a three-dimensional array structure.

A controller 200 in the storage device 30 may be connected to each of the plurality of non-volatile memory packages 100-1 to 100-n through a plurality of channels CH1, CH2 . . . CHn. Each of the plurality of non-volatile memory packages 100-1 to 100-n according to some example embodiments may be connected to a controller through one channel among the plurality of channels CH1 to CHn. A channel may be realized through conductive lines including one or more of printed wiring, traces, vias, pads and solder bumps. Some conductive lines may be internal to a substrate or other circuit structure, for example, an interposer.

The controller 200 may send and receive a control signal SGL to and from the host 20 through the signal connector 210. The control signal SGL may include commands, addresses, and/or data and the like. The controller 200 may write data on the plurality of non-volatile memory packages 100-1 to 100-n or may read data from the plurality of non-volatile memory packages 100-1 to 100-n in accordance with the commands of the host 20.

The storage device 30 may further include an auxiliary power supply 300. The auxiliary power supply 300 receives the power PWR from the host 20 through the power connector 310 and may supply the power to the controller 200. The position of the auxiliary power supply 300 is not limited thereto, and may be located outside the storage device 30.

Figure 2:
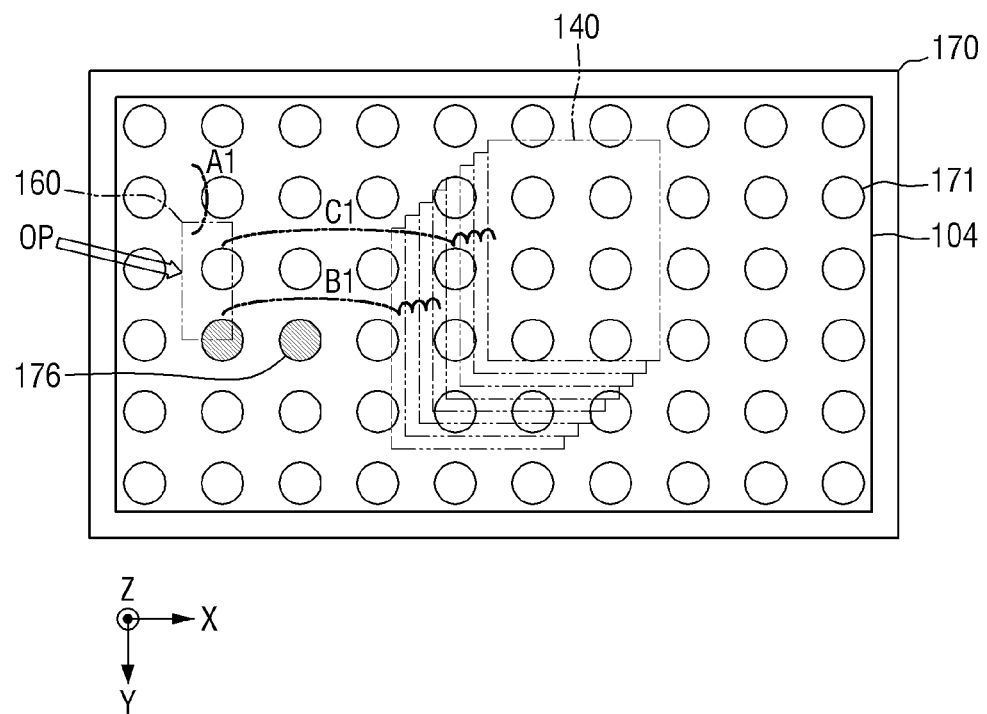
FIG. 2 is a bottom view showing a non-volatile memory package according to some example embodiments.

FIG. 2 is a bottom view showing a non-volatile memory package according to some example embodiments.

Referring to FIG. 2, a non-volatile memory package according to some example embodiments may be placed on a package ball map 170. A package ball map, in some embodiments, provides a symbolic depiction showing the positions of, for example, solder balls, on a substrate. The map may include labels indicating circuit signals to be connected by way of a particular point on the map, for example, a particular solder ball may be associated with circuit ground. The map provides relationships of the solder bumps in space on the surface, for example, of a substrate or package.

The non-volatile memory package according to some example embodiments may include a plurality of non-volatile memory chips 140 stacked in a certain direction, a buffer chip 160 connected to balls electrically connected to the outside through a substrate 104, and a plurality of wires A1, B1 and C1 that electrically connects between the non-volatile memory chips 140 and the buffer chip 160.

More specifically, a first wire A1 may electrically connect the buffer chip 160 and the outside. Also, a second wire B1 electrically connects a part of a plurality of non-volatile memory chips 140 and may electrically connect it to the buffer chip 160. Also, a third wire C1 electrically connects a part of a plurality of non-volatile memory chips 140 and may electrically connect it to the buffer chip 160.

In all the following descriptions, the form in which the plurality of non-volatile memory chips 140 is stacked is not limited thereto. Further, the number of the plurality of non-volatile memory chips 140 is also not limited thereto. Further, the forms of the plurality of non-volatile memory chips 140 and the buffer chip 160 are also not limited thereto. Further, the form in which the plurality of wires A1, B1 and C1 is connected is also not limited thereto.

Figure 3:
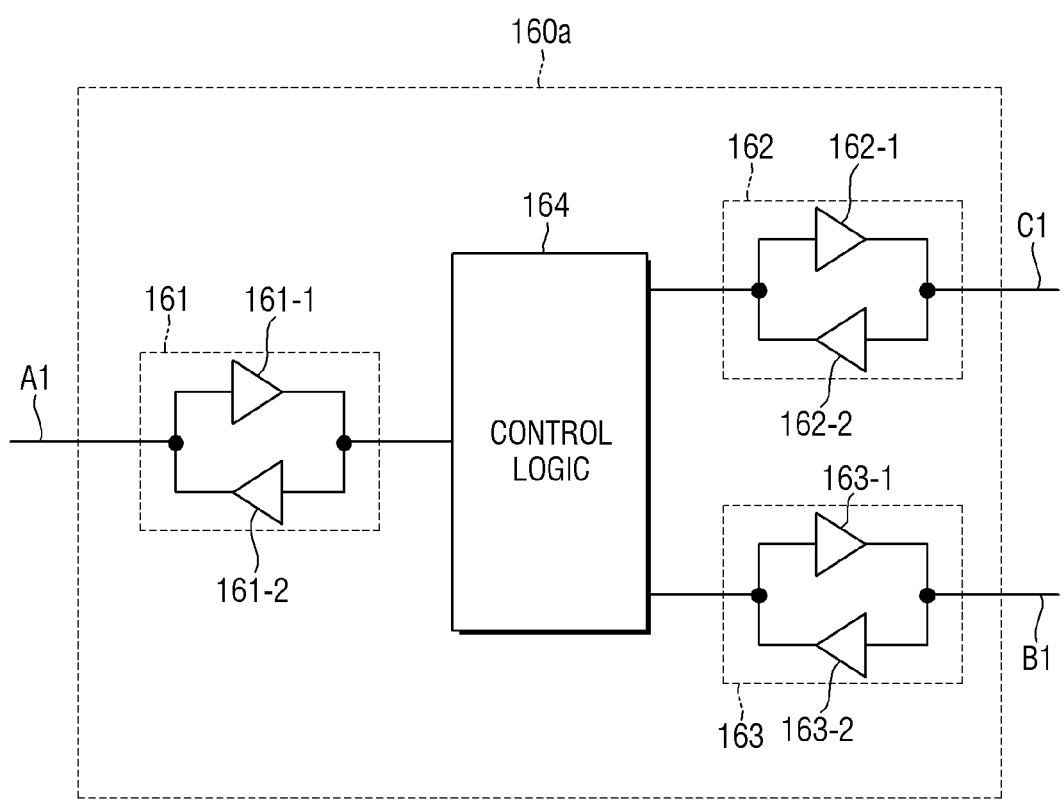
FIG. 3 is a circuit diagram showing the buffer chip of FIG. 2.
Figure 4:
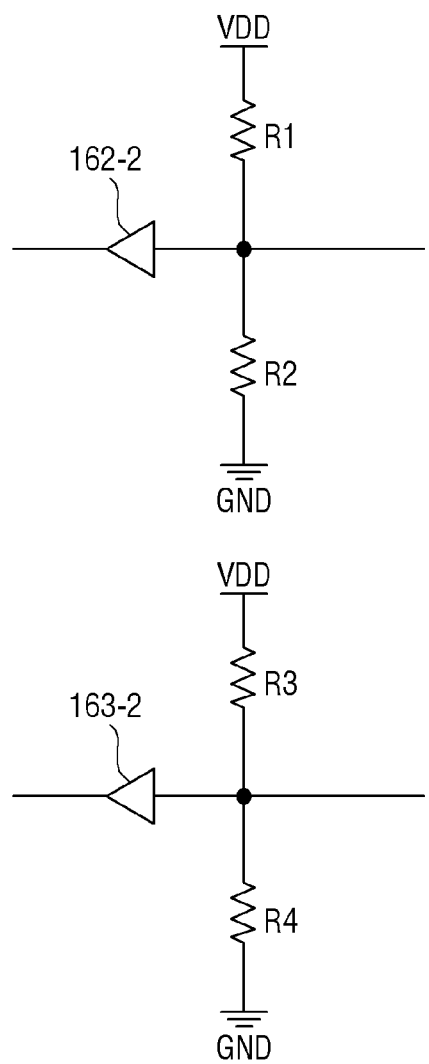
FIG. 4 is a circuit diagram showing a second receiver and a third receiver of FIG. 3.

After examining the configuration of the buffer chip 160 in a little more detail referring to FIGS. 3 and 4, the explanation will be continued again through FIG. 2.

FIG. 3 is a circuit diagram showing details of the buffer chip of FIG. 2. FIG. 4 is a circuit diagram showing a second receiver and a third receiver of FIG. 3.

Referring to FIGS. 2 and 3, a buffer chips 160a according to some example embodiments may include a first port 161, a second port 162, a third port 163, and a control logic 164.

The first port 161 may send and receive data to and from the controller 200 through the first wire A1. The second port 162 may send and receive data to and from a part of the plurality of non-volatile memory chips 140 through the third wire C1. The third port 163 may send and receive data to and from the other part of the plurality of non-volatile memory chips 140 through the second wire B1.

The control logic 164 may provide the data received from the first port 161 to a part of the plurality of non-volatile memory chips 140 through the second port 162, or may provide the data to the other part of the plurality of non-volatile memory chips 140 through the third port 163.

The control logic 164 may provide the data received from a part of the plurality of non-volatile memory chips 140 (a first portion) to the first port 161 through the second port 162. Further, the control logic 164 may provide the data received from the other part of the plurality of non-volatile memory chips 140 (a second portion) to the first port 161 through the third port 163.

The first port 161 according to some example embodiments may include a first receiver 161-1 which receives data from the controller, and a first driver 161-2 which provides data to the controller. The second port 162 according to some example embodiments may include a second receiver 162-2 that receives data from a part of a plurality of non-volatile memory chips 140, and a second driver 162-1 which provides data from the control logic 164 to a part of a plurality of non-volatile memory chips 140. The third port 163 according to some example embodiments may include a third receiver 163-2 that receives data from the other part of the plurality of non-volatile memory chips 140, and a third driver 163-1 which provides data from the control logic 164 to the other part of the plurality of non-volatile memory chips 140. The optimum operating parameters of the first port 161 to the third port 163 according to some example embodiments may be different from each other.

Referring to FIGS. 3 and 4, the second receiver 162-2 may include on-die termination (ODT) resistors R1 and R2 connected between the power supply voltage VDD and the ground voltage GND. Similarly, the third receiver 163-2 may include on-die termination resistors R3 and R4 connected between the power supply voltage VDD and the ground voltage GND. That is, the size of the on-die termination resistors R1 and R2 of the second receiver 162-2 and the size of the on-die termination resistors R3 and R4 of the third receiver 163-2 may be set independently of each other.

Referring to FIG. 2 again, positions of I/O pads to be placed on a lower side of the substrate 104 may be printed on the package ball map 170. For example, positions 176 of the I/O pads connected to the buffer chip 160 may be printed on the package ball map 170. Further, for example, positions 171 of other chips or other I/O pads connected to the outside, that is, configured to connect outside of a non-volatile memory package 100-1, may be printed on the package ball map 170.

At this time, the buffer chip 160 may be placed at an electrically optimized position OP from the positions 176 of the I/O pads connected to the buffer chip 160. For example, the optimized position OP may be a position at which a length of a connection wiring between the buffer chip 160 and the position 176 of the I/O pads is minimized. The position OP may be located at regular intervals from the edge of the substrate 104. The edge of the substrate 104 may be four line portions placed at the final end of the substrate 104, for example, when the substrate 104 has a rectangular shape.

However, in a comparative example corresponding to FIG. 9 below, if different non-volatile memory chips are placed on the substrate 104, the position at which the buffer chip 160 is placed on the substrate 104 may change. That is, the buffer chip is placed at a position other than the optimum position OP determined on the basis of the position 176 of the I/O pad connected to the buffer chip placed on the package ball map 170, and the signal transmission performance between the buffer chip and the I/O pad may be deteriorated. Compare FIG. 9 (deteriorated) to FIG. 10 (performance maintained).

Therefore, in the non-volatile memory packages according to some example embodiments, when different non-volatile memory chips are placed on the substrate 104, by fixing the position of the buffer chips each connected to the different non-volatile memory chips at the optimum position OP, it is possible to maintain a state in which the signal transmission performance between the buffer chip and the buffer chip I/O pad is optimized. This will be explained further in the discussion below of FIG. 10. Fixing the position of the buffer chips each connected to the different non-volatile memory chips at the optimum position OP will be explained in detail through FIG. 5A. The repeated explanation of the contents explained above will not be provided below.

Figure 5A:
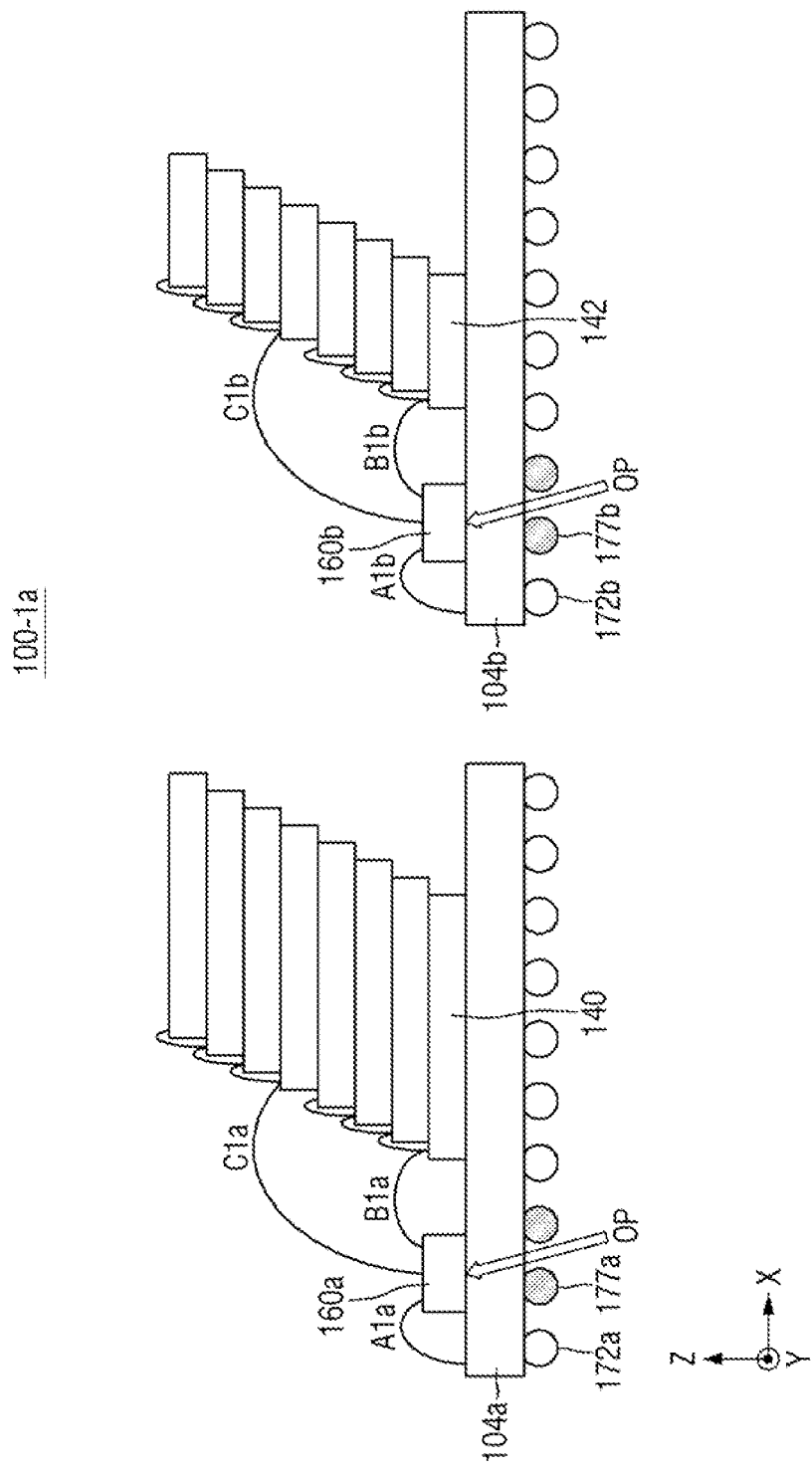
FIG. 5A is a diagram showing a non-volatile memory package with two substrates according to some example embodiments.

FIG. 5A is a diagram showing a non-volatile memory package according to some example embodiments.

Referring to FIG. 5A, a non-volatile memory package 100-1a according to some example embodiments may include non-volatile memory chips 140 and 142 different from each other. The first non-volatile memory chip 140 and the second non-volatile memory chip 142 may have sizes different from each other. For example, the first non-volatile memory chip 140 and the second non-volatile memory chip 142 may have physical sizes different from each other. Also, the first non-volatile memory chip 140 and the second non-volatile memory chip 142 may have data storage capacities different from each other.

In all the following explanation, the type and number of non-volatile memory chips included in the non-volatile memory package 100-1a according to some example embodiments are not limited thereto.

In the non-volatile memory package 100-1a according to some example embodiments, a first buffer chip 160a and a plurality of first non-volatile memory chips 140 may be placed on an upper side of the first substrate 104a. The number and form of the plurality of first non-volatile memory chips 140 are not limited thereto, and a stacked direction is also not limited thereto. For example, a part of the plurality of first non-volatile memory chips 140 may be stacked in one direction, and the other part of the plurality of first non-volatile memory chips 140 may be stacked in a different direction.

The first buffer chip 160a and the plurality of first non-volatile memory chips 140 may be electrically connected through a second wire B1a and a third wire C1a. Further, the first buffer chip 160a may be electrically connected to the outside (for example, the controller 200) through the first wire A1a. Although the first buffer chip 160a may be connected to the first substrate 104a in the form of a flip chip, the type in which the first buffer chip 160a is connected to the first substrate 104a is not limited thereto.

A plurality of I/O pads 172a and 177a may be placed on the lower, or bottom, side of the first substrate 104a extending in a first direction x, see FIG. 5A. For example, the positions at which an external connection terminal 172a among the plurality of I/O pads 172a and 177a is placed may be placed at the printed position 171 in the package ball map 170 of FIG. 2. Further, for example, the position at which the connection terminal 177a connected to the first buffer chip 160*a* among the plurality of I/O pads 172*a* and 177*a* is placed may be placed at the printed position 176 in the package ball map 170 of FIG. 2.

At this time, the first buffer chip 160*a* may be placed at the position OP of the substrate 104*a* that may be electrically optimized with the connection terminal 177*a*.

Further, in the non-volatile memory package 100-1*a* according to some example embodiments, a second buffer chip 160*b* and a plurality of first non-volatile memory chips 142 may be placed on the upper side of a second substrate 104*b*. The number and form of the plurality of second non-volatile memory chips 142 are not limited thereto, and the stacked direction is also not limited thereto. For example, a part of the plurality of second non-volatile memory chips 142 may be stacked in one direction, and the other part of the plurality of second non-volatile memory chips 142 may be stacked in a different direction.

In some example embodiments, the first substrate 104*a* with first non-volatile memory chips 140 and the second substrate 104*b* with second non-volatile memory chips 142 are bundled in a single non-volatile memory package 100-1*a* as illustrated in FIG. 5A. A package ball map of the first substrate 104*a* and a package ball map of the second substrate 104*b*, although supporting use of different size memory chips may be the same. That is, a single package ball map may be used although different size memory chips are used in the same non-volatile memory package.

FIG. 5B illustrates a bottom view of the package 100-1*a* of FIG. 5A. In a non-limiting example, the buffer chip 160*a* is in a corner of substrate 104*a* and the buffer chip 160*b* is in a corner of the substrate 104*b*.

The bundling in the single non-volatile memory package 100-1*a* may be implemented, as an example, using a circuit structure providing conductive lines between the single non-volatile memory package 100-1*a* and the memory controller 200. CH1 may be implemented using the circuit structure. The single non-volatile memory package 100-1*a* may then communicate with the memory controller 200 of FIG. 1 via CH1. This also applies to CH2, . . . , CHN.

Referring again to FIG. 5A, the second buffer chip 160*b* and the plurality of second non-volatile memory chips 142 may be electrically connected through a second wire B1*b* and a third wire C1*b*. Further, the second buffer chip 160*b* may be electrically connected to the outside (for example, to the controller 200) through the first wire A1*b*. Although the second buffer chip 160*b* may be connected to the second substrate 104*b* in the form of a flip chip, the type in which the second buffer chip 160*b* is connected to the second substrate 104*b* is not limited thereto.

A plurality of I/O pads 172*b* and 177*b* may be placed on the lower, or bottom, side of the second substrate 104*b* extending in the first direction x. For example, the position at which the external connection terminals 172*b* among the plurality of I/O pads 172*b* and 177*b* is placed may be placed at the printed position 171 in the package ball map 170 of FIG. 2. Further, for example, the position at which the connection terminal 177*b* connected to the second buffer chip 160*b* among the plurality of I/O pads 172*b* and 177*b* is placed may be placed at the printed position 176 in the package ball map 170 of FIG. 2.

At this time, the second buffer chip 160*b* may be placed at the position OP of the substrate 104*b* that may be electrically optimized with the connection terminal 177*b*.

That is, the first non-volatile memory chips 140 placed on the first substrate 104*a*, and the second non-volatile memory chips 142 placed on the second substrate 104*b* may have different types and sizes from each other. However, the position OP of the first buffer chip 160*a* connected to the first non-volatile memory chip 140 placed on the first substrate 104*a* is the same as the position OP of the second buffer chip 160*b* connected to the second non-volatile memory chips 142 placed on the second substrate 104*b*.

For example, the sizes and shapes of the first substrate 104*a* and the second substrate 104*b* are the same, and the position OP at which the buffer chips 160*a* and 160*b* are placed on the respective substrates 104*a* and 104*b* may be spaced from the edges of the respective substrates 104*a* and 104*b* at equal intervals.

Therefore, since the position OP at which the buffer chips 160*a* and 160*b* in the non-volatile memory package 100-1*a* according to some example embodiments are placed on the substrate are fixed, all the buffer chips 160*a* and 160*b* connected to the plurality of different the non-volatile memory chips 140 and 142 may have electrical optimum performance.

For reference, although all the drawings below show that a plurality of I/O pads corresponds to a plurality of solder balls, embodiment are not limited to solder balls. For example, the plurality of I/O pads may be solder bumps, a grid array, one or more conductive tabs or the like. Further, the number and the placement form of the plurality of I/O pads are not limited to the number shown in the drawings.

Figure 6:
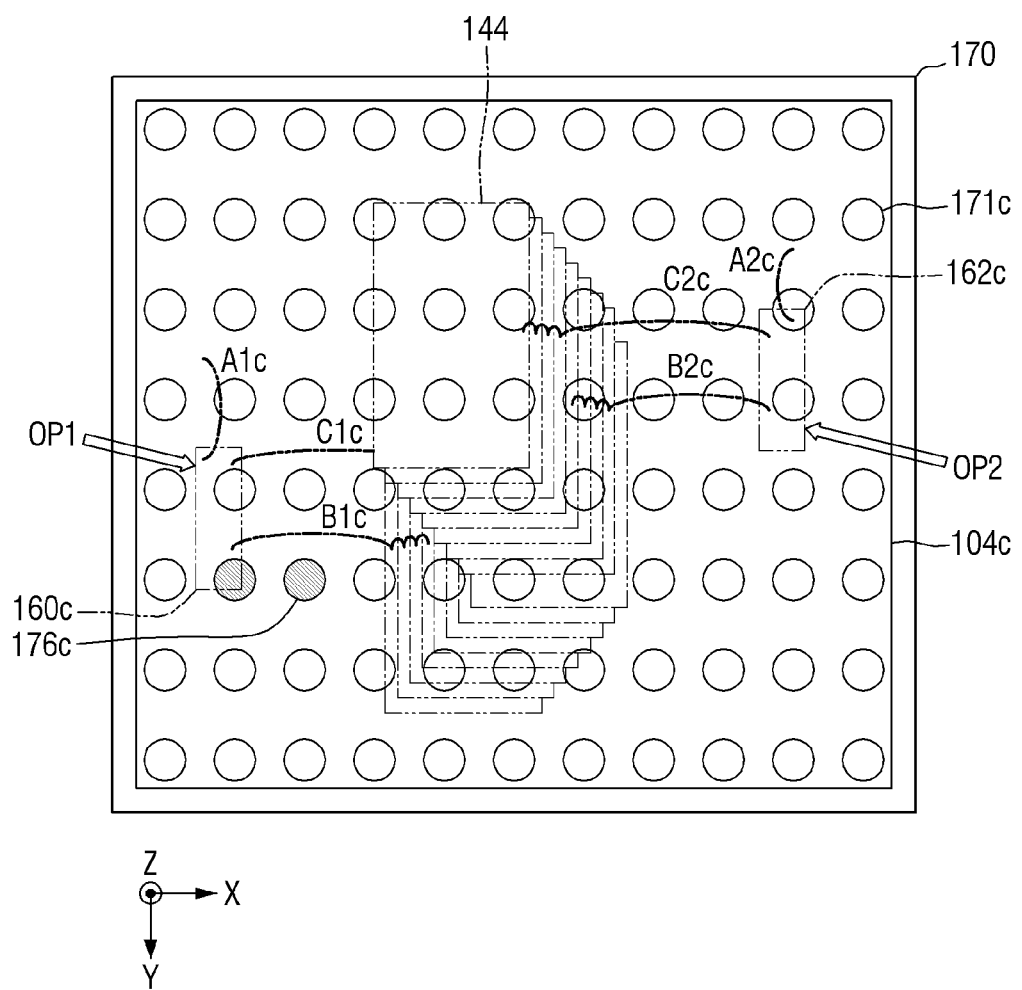
FIG. 6 is a top view showing another non-volatile memory package according to some example embodiments.

FIG. 6 is a top view showing another non-volatile memory package according to some example embodiments.

Referring to FIG. 6, unlike the non-volatile memory package of FIG. 2 according to some example embodiments, a plurality of non-volatile memory chips 144 stacked in different directions may be placed on the substrate 104*c*.

That is, the non-volatile memory package of FIG. 6 according to some example embodiments may include a first buffer chip 160*c* connected to the memory chips stacked in one direction among the plurality of non-volatile memory chips 144, and a second buffer chip 162*c* connected to the memory chips stacked in another direction.

More specifically, the memory chips stacked in one direction among the plurality of non-volatile memory chips 144 are electrically connected to the first buffer chip 160*c* through the second wire B1*c* and the third wire C1*c*. Further, the first buffer chip 160*c* may be electrically connected to the outside (for example, a controller such as, for example, controller 200) through the first wire A1*c*. Further, the memory chips stacked in another direction among the plurality of non-volatile memory chips 144 are electrically connected to the second buffer chips 162*c* through a fifth wire B2*c* and a sixth wire C2*c*. Further, the second buffer chip 162*c* may be electrically connected to the outside (for example, the controller 200) through the fourth wire A2*c*.

The first buffer chip 160*c* may be placed at a position OP1 where the position of the I/O pad connected to the buffer chip is electrically optimized with the printed position 176*c*. Further, the second buffer chip 162*c* may also be placed at the position OP2 where the position of the I/O pad connected to the buffer chip is electrically optimized with the printed position 176*c*.

However, see FIG. 9 and discussion below, when different non-volatile memory chips are placed on the substrate 104*c*, the position at which the buffer chips 160*c* and 162*c* are placed on the substrate 104*c* may change. That is, the buffer chips are placed at a position other than the optimum positions OP1 and OP2 determined on the basis of the position 176*c* of the I/O pad connected to the buffer chip placed in the package ball map 170, and the signal transmission performance between the buffer chip and the I/O pad may be deteriorated (for example, FIG. 9).

Therefore, in the non-volatile memory packages according to some example embodiments, when different non-volatile memory chips are placed on the substrate 104c, by fixing the position of the buffer chips connected to the different non-volatile memory chips at the optimum positions OP1 and OP2, it is possible to maintain a state in which the signal transmission performance between the buffer chip and the buffer chip I/O pad is optimized. This will be explained in detail through FIGS. 7 and 8 below. Also, see FIG. 10 and the discussion below.

Figure 7:
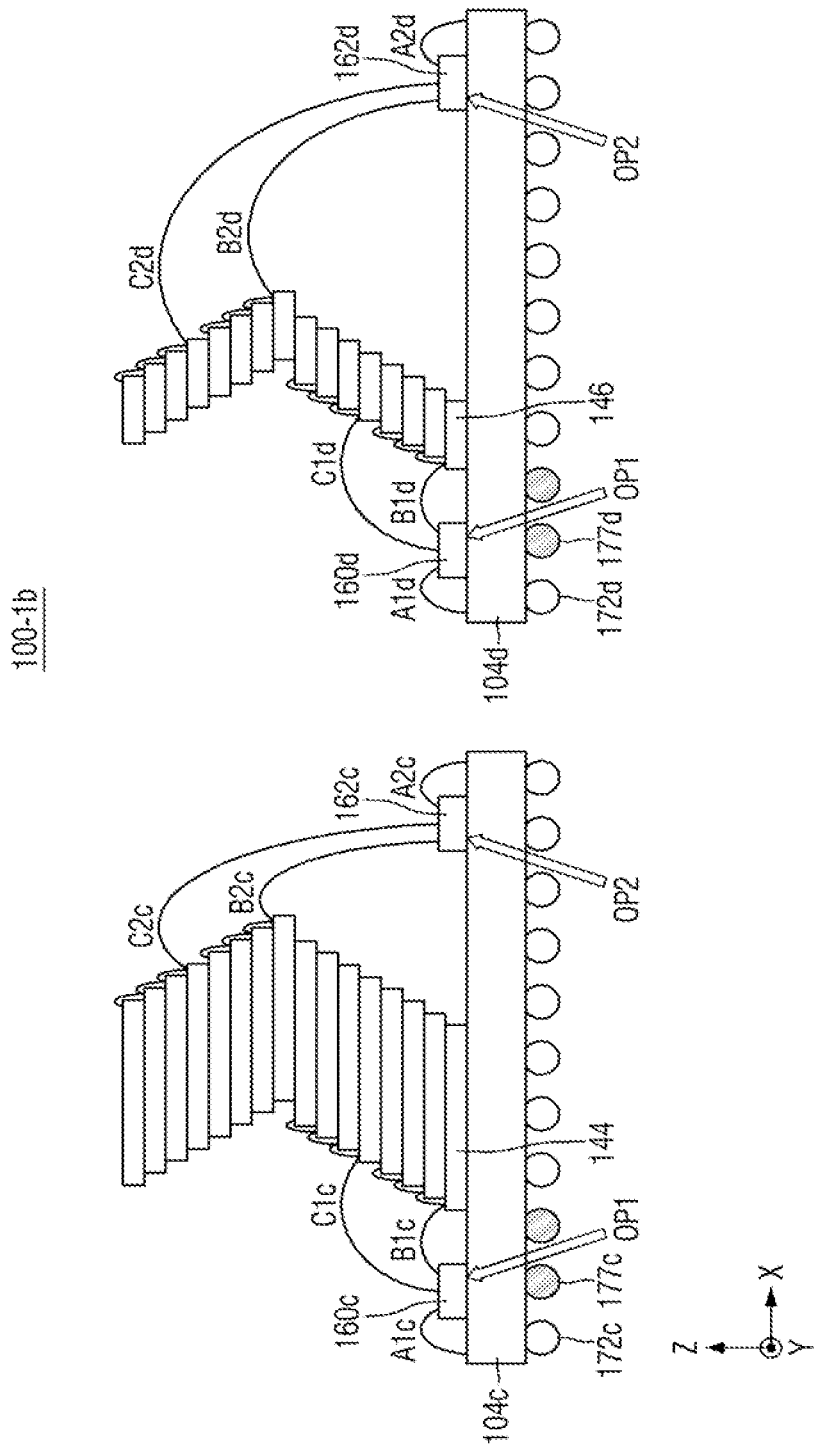
FIGS. 7 and 8 are exemplary diagrams showing another non-volatile memory package according to some example embodiments.
Figure 8:
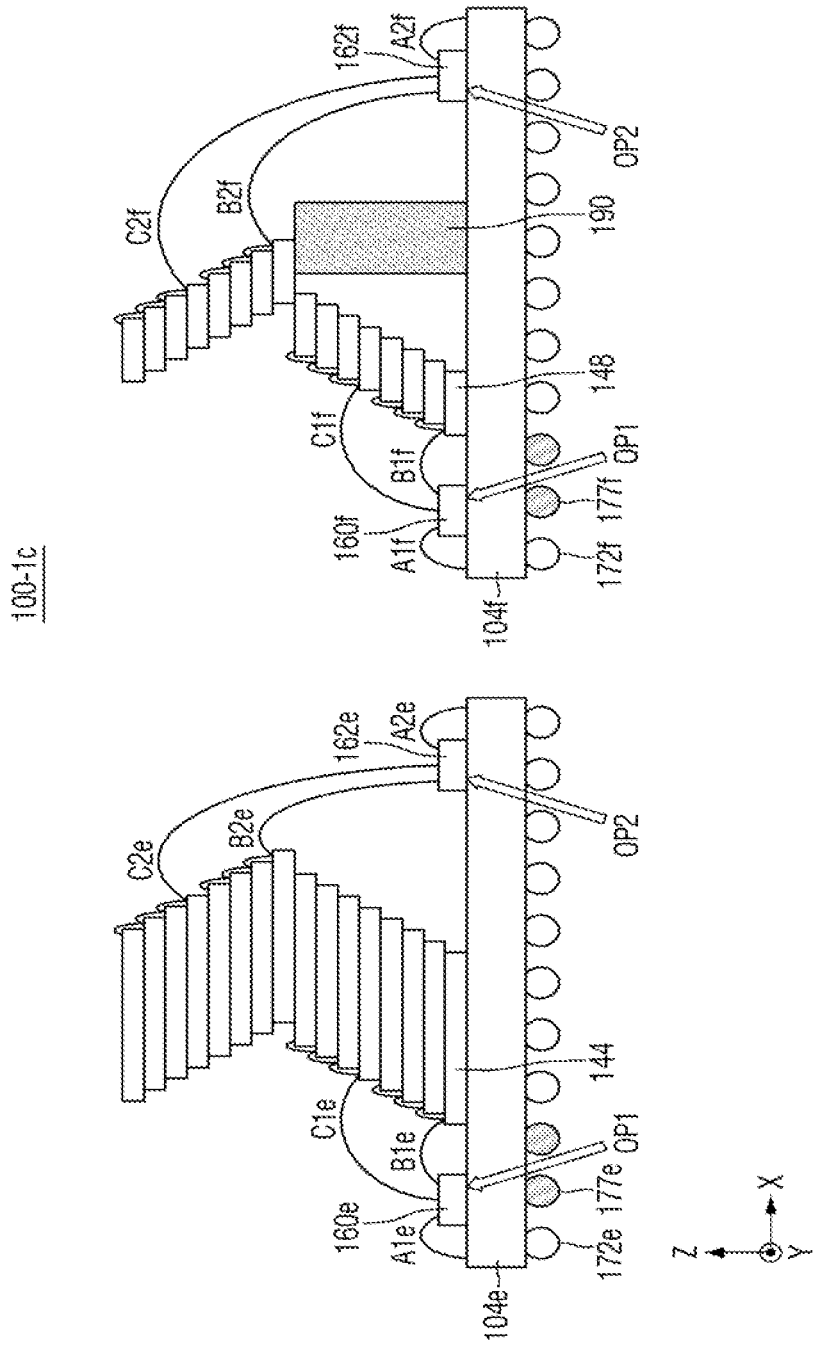

FIGS. 7 and 8 are exemplary diagrams showing another non-volatile memory package according to some example embodiments.

First, referring to FIG. 7, unlike the plurality of memory chips of the non-volatile memory package 100-1a according to some example embodiments of FIG. 5A, each of the non-volatile memory chips 144 and 146 according to some example embodiments of FIG. 7 may be stacked in a form in which includes different directions. The third non-volatile memory chip 144 and the fourth non-volatile memory chip 146 may have different sizes from each other. For example, the third non-volatile memory chip 144 and the fourth non-volatile memory chip 146 may have different physical sizes from each other. Also, the third non-volatile memory chip 144 and the fourth non-volatile memory chip 146 may have different data storage capacities from each other.

In all the following explanation, the type and number of non-volatile memory chips included in a non-volatile memory package 100-1b according to some example embodiments are not limited thereto.

In the non-volatile memory packages 100-1b according to some example embodiments, a first-1 buffer chip 160c and a plurality of third non-volatile memory chips 144 may be placed on the upper side of the first substrate 104c. A part of the plurality of third non-volatile memory chips 144 may be stacked in one direction, and the other part of the plurality of third non-volatile memory chips 144 may be stacked in a different direction.

The non-volatile memory chips stacked in one direction among the first-1 buffer chip 160c and the plurality of third non-volatile memory chips 144 may be electrically connected through a second-1 wire B1c and a third-1 wire C1c. Further, a first-1 buffer chip 160c may be electrically connected to the outside (for example, the controller 200) through a first-1 wire A1c. Although the first-1 buffer chip 160c may be connected to the first substrate 104c in the form of a flip chip, the type of connecting the first-1 buffer chip 160c to the first substrate 104c is not limited thereto.

Also, the non-volatile memory chips stacked in another direction among a second-1 buffer chip 162c and the plurality of third non-volatile memory chips 144 may be electrically connected through a fifth-1 wire B2c and a sixth-1 wire C2c. Further, the second-1 buffer chip 162c may be electrically connected to the outside (for example, the controller 200) through a fourth-1 wire A2c. Although the second-1 buffer chip 162c may be connected to the first substrate 104c in the form of a flip chip, the type of connecting the second-1 buffer chip 162c to the first substrate 104c is not limited thereto.

A plurality of I/O pads 172c and 177c may be placed on the lower side of the first substrate 104c extending in the first direction x, see FIG. 7. For example, the position at which the external connection terminals 172c among the plurality of I/O pads 172c and 177c is placed may be placed at the printed position 171c in the package ball map 170 of FIG. 6. Further, for example, the position at which the connection terminal 177c connected to the first-1 buffer chip 160c is placed among the plurality of I/O pads 172c and 177c may be placed at the printed position 176c in the package ball map 170 of FIG. 5A.

The first-1 buffer chip 160c may be placed at a position OP1 of the upper side of the substrate 104c that may be electrically optimized with the connection terminal 177c. Further, the second-1 buffer chip 162c may be placed at a position OP2 of the upper side of the substrate 104c that may be electrically optimized with the connection terminal 177d.

In the non-volatile memory packages 100-1b according to some example embodiments, a first-2 buffer chip 160d and a plurality of fourth non-volatile memory chips 146 may be placed on an upper side of a second substrate 104d. A part of the plurality of fourth non-volatile memory chips 146 may be stacked in one direction, and the other part of the plurality of fourth non-volatile memory chips 146 may be stacked in a different direction.

The non-volatile memory chips stacked in one direction among the first-2 buffer chip 160d and the plurality of fourth non-volatile memory chips 146 may be electrically connected through a second-2 wire B1d and a third-2 wire C1d. Further, the first-2 buffer chip 160d may be electrically connected to the outside (for example, a controller) through the first-2 wire A1d. Although the first-2 buffer chip 160d may be connected to the second substrate 104d in the form of a flip chip, the type of connecting the first-2 buffer chip 160d to the second substrate 104d is not limited thereto.

Also, the non-volatile memory chips stacked in another direction among the second-2 buffer chip 162d and the plurality of fourth non-volatile memory chips 146 may be electrically connected through a fifth-2 wire B2d and a sixth-2 wire C2d, see FIG. 7. Further, the second-2 buffer chip 162d may be electrically connected to the outside (for example, a controller) through the fourth-2 wire A2d. Although the second-2 buffer chip 162d may be connected to the second substrate 104d in the form of a flip chip, the type of connecting the second-2 buffer chip 162d to the second substrate 104d is not limited thereto.

A plurality of I/O pads 172d and 177d may be placed on the lower side of the second substrate 104d extending in the first direction x. For example, the position at which the external connection terminal 172d among plurality of I/O pads 172d and 177d is placed may be placed at the printed position 171c in the package ball map 170 of FIG. 6. Further, for example, the position at which the connection terminal 177d connected to the first-2 buffer chip 160d among the plurality of I/O pads 172d and 177d is placed may be placed at the printed position 176c in the package ball map 170 of FIG. 5A.

At this time, the first-2 buffer chip 160d may be placed at the position OP1 on the upper side of the substrate 104d that may be electrically optimized with the connection terminal 177d. Further, the second-2 buffer chip 162d may be placed at the position OP2 on the upper side of the substrate 104d that may be electrically optimized with the connection terminal 177d.

That is, the third non-volatile memory chips 144 placed on the first substrate 104c and the fourth non-volatile memory chips 146 placed on the second substrate 104d may have different types and sizes from each other. However, the position OP1 of the first-1 buffer chip 160c connected to the memory chips stacked in one direction among the third non-volatile memory chips 144 placed on the first substrate 104c is the same as the position OP1 of the first-2 buffer chip 160d connected to the memory chips stacked in one direction among the fourth non-volatile memory chips 146 placed on the second substrate 104d.

For example, the first substrate 104c and the second substrate 104d have the same size and shape, and the positions OP1 and OP2 at which the buffer chips 160c and 160d are placed on the respective substrates 104c and 104d may be spaced from the edges of the respective substrates 104c and 104d at equal intervals.

Figure 10:
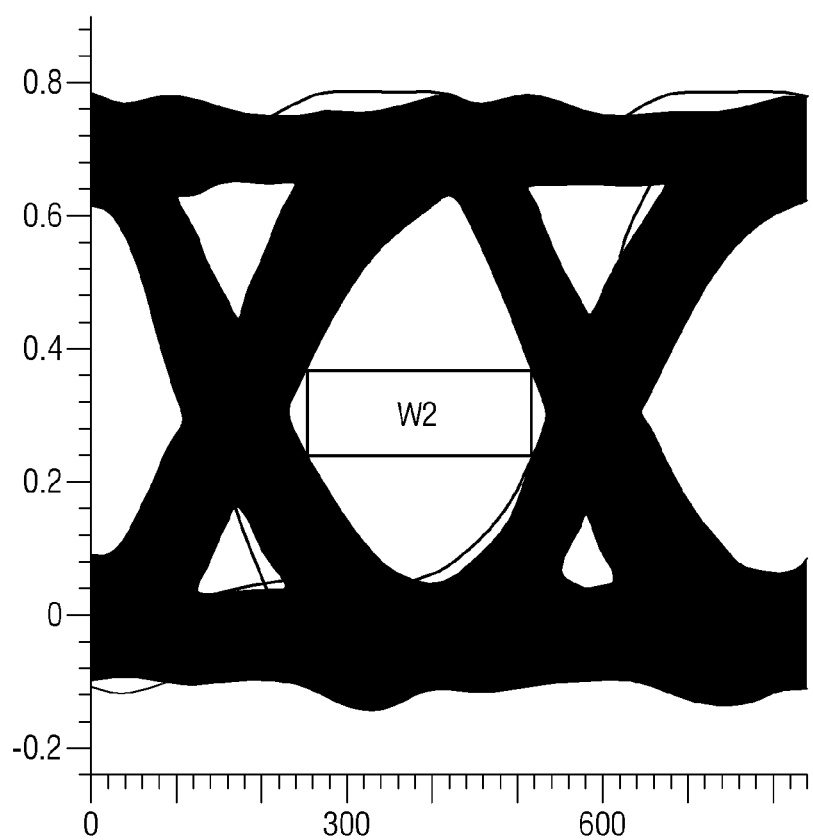
FIG. 10 is an eye diagram of the non-volatile memory package according to some example embodiments.

Therefore, because the position OP1 at which the buffer chips 160c and 160d in the non-volatile memory package 100-1b according to some example embodiments are placed on the substrate is fixed, both the buffer chips 160c and 160d connected to the plurality of different non-volatile memory chips 144 and 146 may have optimum electrical performance, see for example FIG. 10.

Further, the position OP2 of the second-1 buffer chip 162c connected to the memory chips stacked in another direction among the third non-volatile memory chips 144 placed on the first substrate 104c is the same as the position OP2 of the second-2 buffer chip 162d connected to the memory chips stacked in another direction among the fourth non-volatile memory chips 146 placed on the second substrate 104d. Therefore, because the position OP2 at which the buffer chips 162c and 162d in the non-volatile memory package 100-1b according to some example embodiments are placed on the substrate is fixed, both the buffer chips 162c and 162d connected to the plurality of different non-volatile memory chips 144 and 146 may have optimum electrical performance.

Referring to FIG. 8, in a non-volatile memory package 100-1c of FIG. 8 according to some example embodiments, a size of a non-volatile memory chip 148 may be smaller than the size of the non-volatile memory chip 146, as compared with the non-volatile memory package 100-1b of FIG. 7 according to some example embodiments. Since other explanations are the same as those of FIG. 7, the explanations thereof will not be provided.

Further, the non-volatile memory package 100-1c of FIG. 8 may include a support 190, also referred to herein as a support component, that supports at least a part of the non-volatile memory chip 148 to fix the position of the buffer chip 162f at the electrical optimum position O2.

The support 190 extends in the third direction Z, is placed on the substrate 104f and may support at least a part of the plurality of non-volatile memory chips 148. Accordingly, at least a part of the plurality of non-volatile memory chips 148 may be prevented from collapsing. The support 190 may include, for example, an insulating material.

Figure 9:
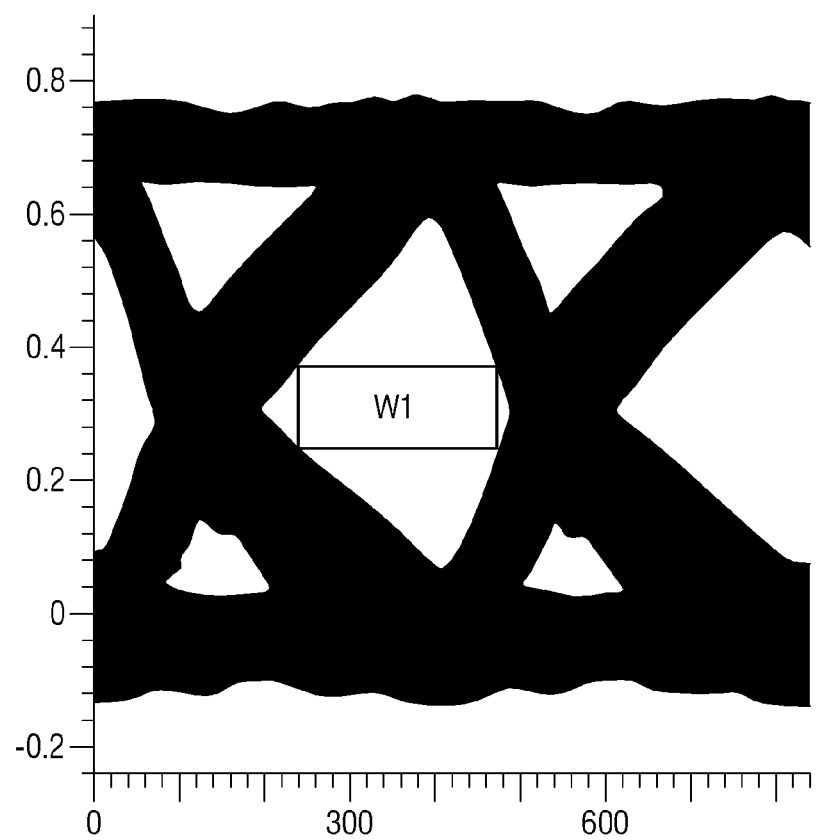
FIG. 9 is an eye diagram of a non-volatile memory package in which the position of the buffer chip is not fixed.

FIG. 9 is an eye diagram of a non-volatile memory package in which the position of the buffer chip is not fixed. FIG. 10 is an eye diagram of the non-volatile memory package according to some example embodiments.

Referring to FIGS. 9 and 10, a window W1 of the eye diagram in which the position of the buffer chip of the non-volatile memory package is not fixed may be smaller than a window W2 of the eye diagram of the non-volatile memory package according to some example embodiments.

Figure 11:
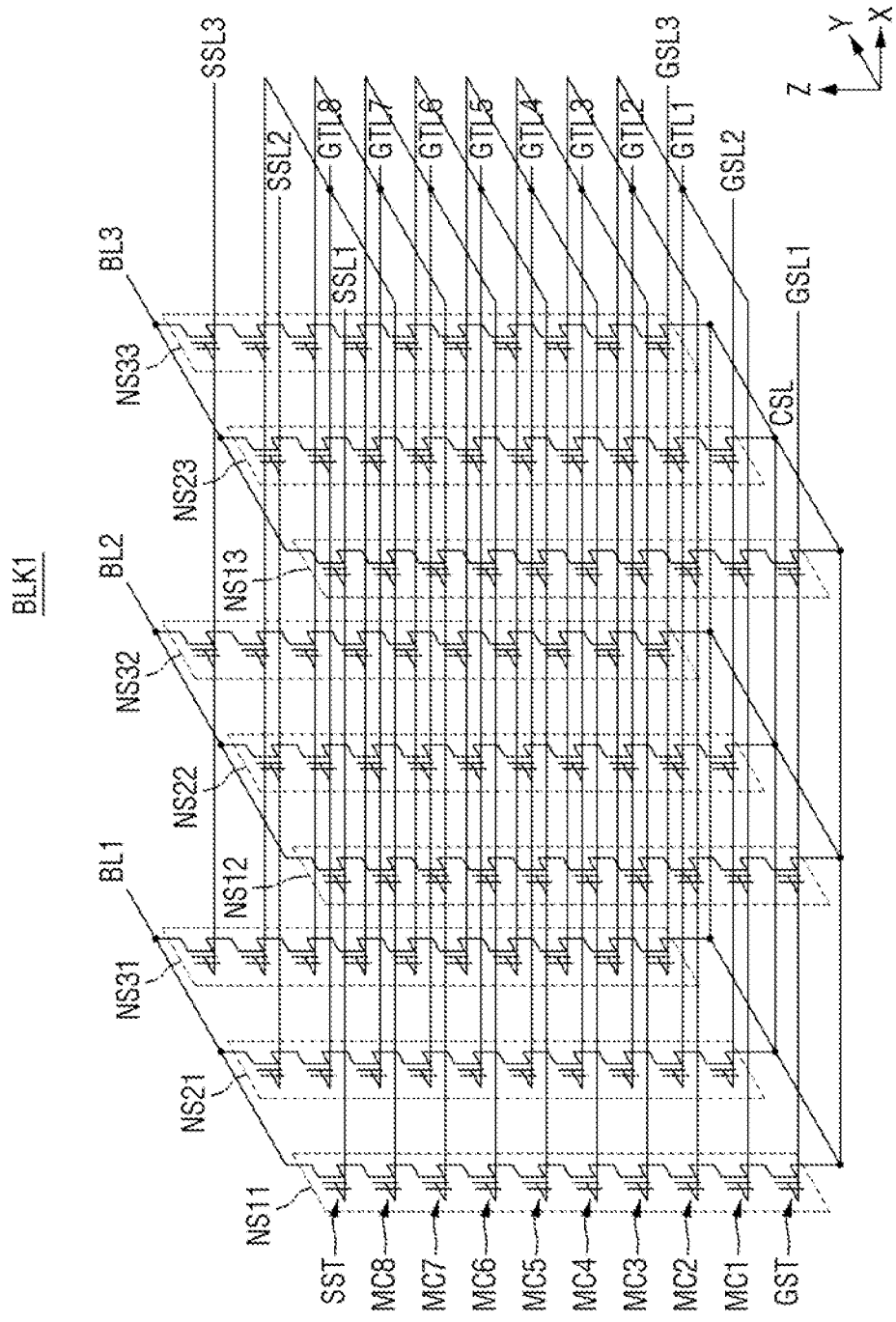
FIG. 11 is a diagram for explaining a 3D V-NAND that may be applied to the non-volatile memory chips according to some example embodiments.

FIG. 11 is a diagram for explaining a 3D V-NAND that may be applied to the non-volatile memory chips according to some example embodiments.

Referring to FIG. 11, when the non-volatile memory chip according to some example embodiments is implemented as a 3D V-NAND type flash memory, each of the plurality of memory blocks which forms the non-volatile memory chips according to some example embodiments may be represented by an equivalent circuit as shown in FIG. 11.

A memory block BLK1 shown in FIG. 11 shows a three-dimensional memory block formed on a substrate as a three-dimensional structure. For example, a plurality of memory NAND strings included in the memory block BLK1 may be formed in a direction perpendicular to the substrate.

Referring to FIG. 11, the memory block BLK1 may include a plurality of memory NAND strings NS11 to NS33 connected between bit lines BL1, BL2 and BL3 and a common source line CSL. Each of the plurality of memory NAND strings NS11 to NS33 may include a string selection transistor SST, a plurality of memory cells MC1, MC2, . . . , MC8 and a ground selection transistor GST. Although FIG. 11 shows that a plurality of memory NAND strings NS11 to NS33 each includes eight memory cells MC1, MC2, . . . , MC8, the embodiment is not necessarily limited thereto.

The string selection transistor SST may be connected to the corresponding string selection lines SSL1, SSL2 and SSL3. A plurality of memory cells MC1, MC2, . . . , MC8 may be connected to the respective corresponding gate lines GTL1, GTL2, GTL8. The gate lines GTL1, GTL2, GTL8 may correspond to word lines, and some of the gate lines GTL1, GTL2, GTL8 may correspond to dummy word lines. The ground selection transistor GST may be connected to the corresponding ground selection lines GSL1, GSL2 and GSL3. The string selection transistor SST may be connected to the corresponding bit lines BL1, BL2 and BL3, and the ground selection transistor GST may be connected to the common source line CSL.

Word lines of the same height (e.g., GTL1) are commonly connected, and the ground selection lines GSL1, GSL2 and GSL3 and the string selection lines SSL1, SSL2 and SSL3 may be separated from each other. Although FIG. 11 shows that the memory block BLK is connected to eight gate lines GTL1, GTL2, GTL8 and three bit lines BL1, BL2 and BL3, the embodiment is not necessarily limited thereto.

Figure 12:
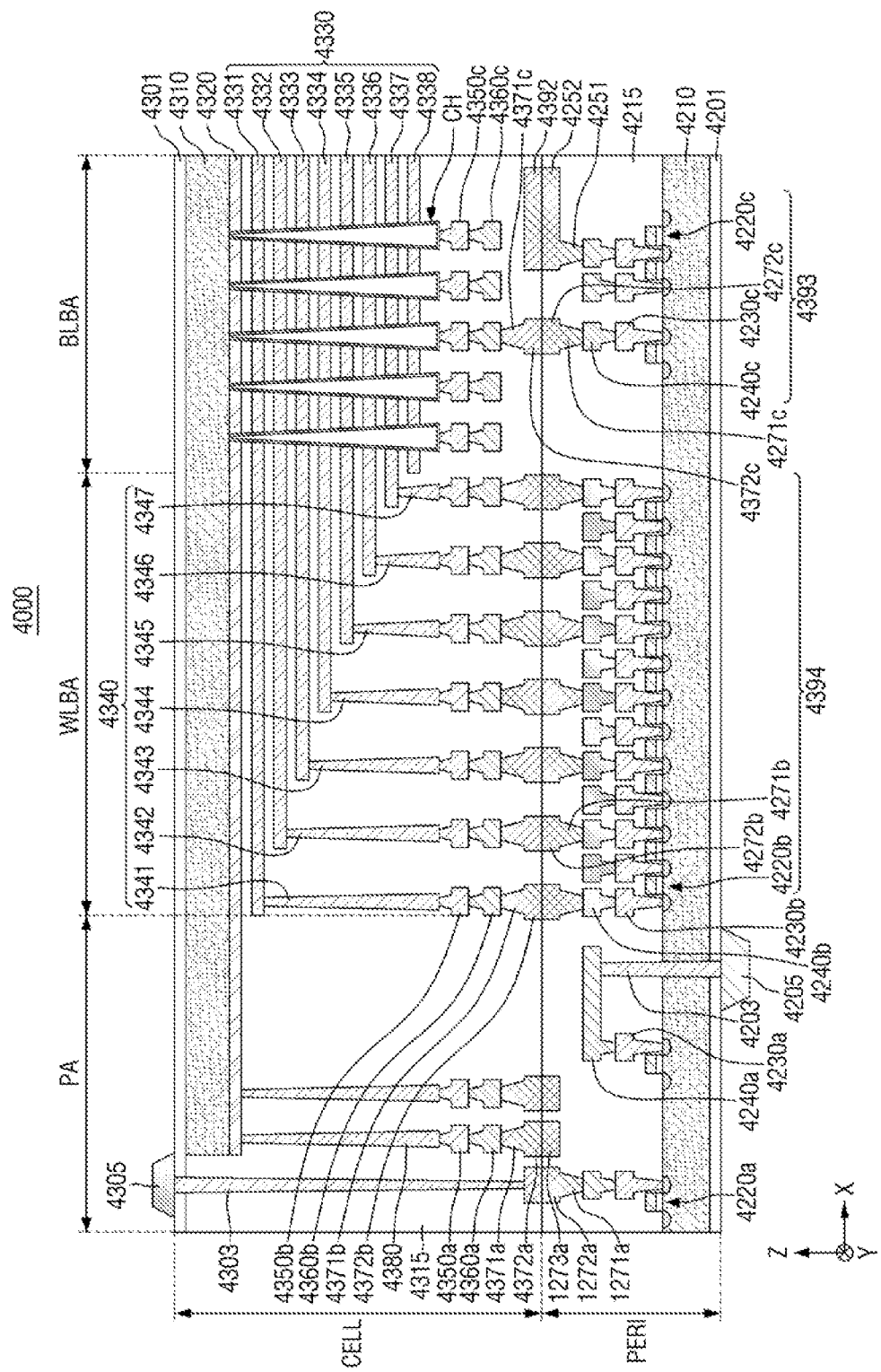
FIG. 12 is a diagram for explaining a BVNAND structure that may be applied to the non-volatile memory chip according to some example embodiments.

FIG. 12 is a diagram for explaining a BVNAND structure that may be applied to the non-volatile memory chip according to some example embodiments.

Referring to FIG. 12, a memory device 4000 included in the non-volatile memory chips according to some example embodiments may have a C2C (chip to chip) structure. The C2C structure may mean a structure in which an upper chip including a cell region CELL is manufactured on a first wafer, a lower chip including a peripheral circuit region PERI is manufactured on a second wafer different from the first wafer, and thereafter, the upper chip and the lower chip are connected to each other by a bonding way. As an example, the bonding way may mean a way of electrically connecting a bonding metal formed on the uppermost metal layer of the upper chip and a bonding metal formed on the uppermost metal layer of the lower chip to each other. For example, when the bonding metal is formed of copper (Cu), the bonding way may be a Cu—Cu bonding way, and the bonding metal may also be formed of aluminum or tungsten.

Each of a peripheral circuit region PERI and a cell region CELL of the memory device 4000 may include an external pad bonding region PA, a word line bonding region WLBA, and a bit line bonding region BLBA.

The peripheral circuit region PERI may include a first substrate 4210, an interlayer insulating layer 4215, a plurality of circuit elements 4220a, 4220b and 4220c formed on the first substrate 4210, first metal layers 4230a, 4230b and 4230c connected to each of the plurality of circuit elements 4220a, 4220b and 4220c, and second metal layers 4240a, 4240b and 4240c formed on the first metal layers 4230a, 4230b and 4230c. In an embodiment, the first metal layers 4230a, 4230b and 4230c may be made of tungsten which has a relatively high resistance, and the second metal layers 4240a, 4240b and 4240c may be formed of copper which has a relatively low resistance.

Although only the first metal layers 4230*a*, 4230*b* and 4230*c* and the second metal layers 4240*a*, 4240*b* and 4240*c* are shown and explained in the present specification, the present disclosure is not limited thereto, and at least one or more metal layers may be further formed on the second metal layers 4240*a*, 4240*b* and 4240*c*. At least a part of one or more metal layers formed over the second metal layers 4240*a*, 4240*b* and 4240*c* may be formed of aluminum or the like which has a lower resistance than the copper forming the second metal layers 4240*a*, 4240*b* and 4240*c*.

The interlayer insulating layer 4215 is placed on the first substrate 4210 to cover the plurality of circuit elements 4220*a*, 4220*b* and 4220*c*, the first metal layers 4230*a*, 4230*b* and 4230*c*, and the second metal layers 4240*a*, 4240*b* and 4240*c*, and may include insulating materials such as silicon oxides and silicon nitrides.

Lower bonding metals 4271*b* and 4272*b* may be formed on the second metal layer 4240*b* of the word line bonding region WLBA. In the word line bonding region WLBA, the lower bonding metals 4271*b* and 4272*b* of the peripheral circuit region PERI may be electrically connected to the upper bonding metals 4371*b* and 4372*b* of the cell region CELL by a bonding way, and the lower bonding metals 4271*b* and 4272*b* and the upper bonding metals 4371*b* and 4372*b* may be formed of aluminum, copper, tungsten, or the like.

The cell region CELL may provide at least one memory block. The cell region CELL may include a second substrate 4310 and a common source line 4320. A plurality of word lines (4331 to 4338; 4330) may be stacked on the second substrate 4310 along a direction (a Z-axis direction) perpendicular to the upper side of the second substrate 4310. String selection lines and a ground selection line may be placed above and below the word lines 4330, and a plurality of word lines 4330 may be placed between the string selection lines and the ground selection line.

In the bit line bonding region BLBA, a channel structure CH extends in the direction perpendicular to the upper side of the second substrate 4310, and may penetrate the word lines 4330, the string selection lines, and the ground selection line. The channel structure CH may include a data storage layer, a channel layer, a buried insulating layer, and the like, and the channel layer may be electrically connected to a first metal layer 4350*c* and a second metal layer 4360*c*. For example, the first metal layer 4350*c* may be a bit line contact, and the second metal layer 4360*c* may be a bit line. In an embodiment, the bit line 4360*c* may extend along a first direction (a Y-axis direction) parallel to the upper side of the second substrate 4310.

In an embodiment shown in FIG. 12, a region in which the channel structure CH and the bit line 4360*c* are placed may be defined as a bit line bonding region BLBA. The bit line 4360*c* may be electrically connected to circuit elements 4220*c* that provide a page buffer 4393 in the peripheral circuit region PERI in the bit line bonding region BLBA. As an example, the bit line 4360*c* is connected to the upper bonding metals 4371*c* and 4372*c* in the peripheral circuit region PERI, and the upper bonding metals 4371*c* and 4372*c* may be connected to the lower bonding metals 4271*c* and 4272*c* connected to the circuit elements 4220*c* of the page buffer 4393.

In the word line bonding region WLBA, the word lines 4330 may extend along a second direction (a X-axis direction) parallel to the upper side of the second substrate 4310, and may be connected to a plurality of cell contact plugs (4341 to 4347; 4340). The word lines 4330 and the cell contact plugs 4340 are connected to each other with pads provided by extending at least a part of the word lines 4330 along a second direction with different lengths. A first metal layer 4350*b* and a second metal layer 4360*b* may be connected sequentially to the upper part of the cell contact plugs 4340 connected to the word lines 4330. The cell contact plugs 4340 may be connected to the peripheral circuit region PERI through the upper bonding metals 4371*b* and 4372*b* of the cell region CELL and the lower bonding metals 4271*b* and 4272*b* of the peripheral circuit region PERI in the word line bonding region WLBA.

The cell contact plugs 4340 may be electrically connected to circuit elements 4220*b* that provide a row decoder 4394 in the peripheral circuit region PERI. In an embodiment, an operating voltage of the circuit elements 4220*b* that provide the row decoder 4394 may differ from an operating voltage of the circuit elements 4220*c* that provide the page buffer 4393. As an example, the operating voltage of the circuit elements 4220*c* that provide the page buffer 4393 may be greater than the operating voltage of the circuit elements 4220*b* that provide the row decoder 4394.

A common source line contact plug 4380 may be placed in the external pad bonding region PA. The common source line contact plug 4380 is formed of a conductive material such as metal, metal compound or polysilicon, and may be electrically connected to the common source line 4320. A first metal layer 4350*a* and a second metal layer 4360*a* may be stacked sequentially on the upper part of the common source line contact plug 4380. As an example, the region in which the common source line contact plug 4380, the first metal layer 4350*a*, and the second metal layer 4360*a* are placed may be defined as an external pad bonding region PA.

On the other hand, I/O pads 4205 and 4305 may be placed in the external pad bonding region PA. Referring to FIG. 12, a lower insulation film 4201 which covers the first substrate 4210 may be formed below the first substrate 4210, and the first I/O pad 4205 may be formed on the lower insulation film 4201. The first I/O pad 4205 is connected to at least one of a plurality of circuit elements 4220*a*, 4220*b* and 4220*c* placed in the peripheral circuit region PERI through the first I/O contact plug 4203, and may be separated from the first substrate 4210 by the lower insulation film 4201. Further, a side insulation film may be placed between the first I/O contact plug 4203 and the first substrate 4210 to electrically separate the first I/O contact plug 4203 and the first substrate 4210.

Referring to FIG. 12, an upper insulation film 4301 which covers the upper side of the second substrate 4310 may be formed over the second substrate 4310, and a second I/O pad 4305 may be placed on the upper insulation film 4301. The second I/O pad 4305 may be connected to at least one of a plurality of circuit elements 4220*a*, 4220*b* and 4220*c* placed in the peripheral circuit region PERI through the second I/O contact plug 4303.

According to the example embodiments, the second substrate 4310 and the common source line 4320 may not be placed in the region in which the second I/O contact plug 4303 is placed. Also, the second I/O pad 4305 may not overlap the word line 4380 in the third direction (a Z-axis direction). Referring to FIG. 12, the second I/O contact plug 4303 is separated from the second substrate 4310 in a direction parallel to the upper side of the second substrate 4310, and may be connected to the second I/O pad 4305 by penetrating an intermediate insulating layer 4315 of the cell region CELL.

According to the example embodiments, the first I/O pad 4205 and the second I/O pad 4305 may be selectively formed. As an example, the memory device 4000 may include only the first I/O pad 4205 placed over the first substrate 4201 or may include only the second I/O pad 4305 placed over the second substrate 4301. Or, the memory device 4000 may include both the first I/O pad 4205 and the second I/O pad 4305.

A metal pattern of the uppermost metal layer exists as a dummy pattern in each of the external pad bonding region PA and the bit line bonding region BLBA included in each of the cell region CELL and the peripheral circuit region PERI, or the uppermost metal layer may be emptied.

The memory device 4000 may form a lower metal pattern 4273a having the same shape as the upper metal pattern 4372a of the cell region CELL on the uppermost metal layer of the peripheral circuit region PERI to correspond to the upper metal pattern 4372a formed on the uppermost metal layer of the cell region CELL, in the external pad bonding region PA. The lower metal pattern 4273a formed on the uppermost metal layer of the peripheral circuit region PERI may not be connected to another contact in the peripheral circuit region PERI. Similarly, in the external pad bonding region PA, an upper metal pattern having the same shape as the lower metal pattern of the peripheral circuit region PERI may be formed on the upper metal layer of the cell region CELL to correspond to the lower metal pattern formed on the uppermost metal layer of the peripheral circuit region PERI.

Lower bonding metals 4271b and 4272b may be formed on the second metal layer 4240b of the word line bonding region WLBA. In the word line bonding region WLBA, the lower bonding metals 4271b and 4272b of the peripheral circuit region PERI may be electrically connected to the upper bonding metals 4371b and 4372b of the cell region CELL by a bonding way.

Further, in the bit line bonding region BLBA, an upper metal pattern 4392 having the same shape as the lower metal pattern 4252 of the peripheral circuit region PERI may be formed on the uppermost metal layer of the cell region CELL to correspond to the lower metal pattern 4252 formed on the uppermost metal layer of the peripheral circuit region PERI. No contact may be formed on the upper metal pattern 4392 formed on the uppermost metal layer of the cell region CELL.

Figure 13:
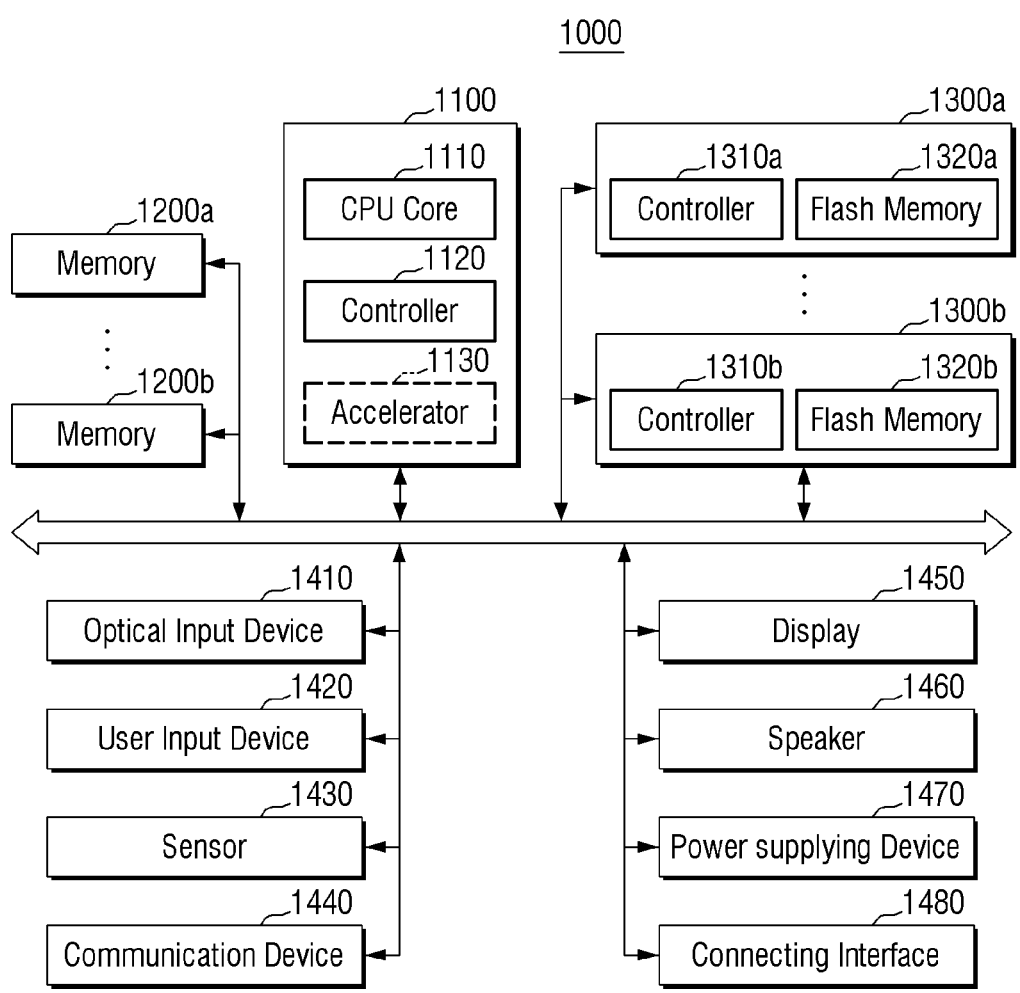
FIG. 13 is a diagram for explaining a system to which the storage devices according to some example embodiments are applied.

FIG. 13 is a diagram for explaining a system to which the storage devices according to some example embodiments are applied.

Referring to FIG. 13, a system 1000 to which the storage device according to some example embodiments is applied may basically be a mobile system such as a mobile phone, a smart phone, a tablet PC (a tablet personal computer), a wearable device, a healthcare device or an IOT (internet of things) device. However, the system 1000 of FIG. 1 is not necessarily limited to a mobile system, but may be a personal computer, a laptop computer, a server, a media player or an automotive device such as a navigation.

Referring to FIG. 13, the system 1000 may include a main processor 1100, memories 1200a and 1200b, and storage devices 1300a and 1300b. The storage devices 1300a and 1300b may be the storage device 30 of FIG. 1 which includes a non-volatile memory package according to some example embodiments. In addition, the storage device may include an image capturing device 1410, a user input device 1420, a sensor 1430, a communication device 1440, a display 1450, a speaker 1460, a power supplying device 1470 and a connecting interface 1480.

The main processor 1100 may control the overall operation of the system 1000, more specifically, the operation of other components that make up the system 1000. Such a main processor 1100 may be implemented by a general purpose processor, a dedicated processor, an application processor, or the like.

The main processor 1100 may include one or more CPU cores 1110, and may further include a controller 1120 for controlling the memories 1200a and 1200b and/or storage devices 1300a and 1300b. According to example embodiments, the main processor 1100 may further include an accelerator block 1130, which is a dedicated circuit for high-speed data operations such as AI (artificial intelligence) data operations. Such an accelerator block 1130 may include a GPU (Graphics Processing Unit), an NPU (Neural Processing Unit) and/or a DPU (Data Processing Unit), and may also be implemented as separate chip which is physically independent of other components of the main processor 1100.

Although the memories 1200a and 1200b may be used as main storage devices of the system 1000 and may include a volatile memory such as a SRAM and/or a DRAM, they may also include a non-volatile memory such as a flash memory, a PRAM and/or a RRAM. The memories 1200a and 1200b can also be implemented in the same package as the main processor 1100.

The storage devices 1300a and 1300b may function as a non-volatile storage device for storing data regardless of a power supply, and may have a relatively large storage capacity as compared with the memories 1200a and 1200b. The storage devices 1300a and 1300b may include storage controllers 1310a 1310b, and non-volatile memory (NVM) storages 1320a 1320b that store data under the control of the storage controllers 1310a and 1310b. Although the non-volatile storages 1320a and 1320b may include a V-NAND flash memory of a 2D (2-dimensional) structure or a 3D (3-dimensional) structure, they may also include other types of non-volatile memory such as a PRAM and/or a RRAM.

The storage devices 1300a and 1300b may be included in the system 1000 in a state of being physically separated from the main processor 1100, and may be implemented in the same package as the main processor 1100. Also, the storage devices 1300a and 1300b may have a shape like a memory card, and may be combined with other components of the system 1000 through an interface such as a connecting interface 1480 to be described later in an attachable and detachable manner. Such storage devices 1300a and 1300b may be devices to which standard conventions such as a UFS (universal flash storage) are applied, but are not necessarily limited thereto.

An image capturing device 1410 may capture still images or moving images, and may be a camera, a camcorder and/or a webcam.

A user input device 1420 may receive various types of data that are input from users of the system 1000, and may be a touch pad, a keypad, a keyboard, a mouse and/or a microphone.

A sensor 1430 may detect various types of physical quantities that may be acquired from the outside of the system 1000 and convert the detected physical quantities into electrical signals. Such a sensor 1430 may be a temperature sensor, a pressure sensor, an illuminance sensor, a position sensor, an acceleration sensor, a bio sensor and/or a gyroscope.

A communication device 1440 may transmit and receive signals to and from other devices outside the system 1000 according to various communication protocols. Such a communication device 1440 may be implemented to include an antenna, a transceiver and/or a modem.

A display 1450 and a speaker 1460 may function as output devices that output each of visual and auditory information to the user of the system 1000.

A power supplying device 1470 may appropriately convert the power supplied from a battery built in the system 1000 and/or an external power supply and supply the power to each component of the system 1000.

A connecting interface 1480 may provide a connection between the system 1000 and an external device that is connected to the system 1000 and may send and receive data to and from the system 1000. The connecting interface 1480 may be implemented in various interface ways such as an ATA (Advanced Technology Attachment), a SATA (Serial ATA), an e-SATA (external SATA), a SCSI (Small Computer Small Interface), a SAS (Serial Attached SCSI), a PCI (Peripheral Component Interconnection), a PCIe (PCI express), a NVMe (NVM express), an IEEE 1394, a USB (universal serial bus), a SD (secure digital) card, a MMC (multi-media card), an eMMC (embedded multi-media card), a UFS (Universal Flash Storage), an eUFS (embedded Universal Flash Storage) and a CF (compact flash) card interface.

In concluding the detailed description, those skilled in the art will appreciate that many variations and modifications may be made to the example embodiments without substantially departing from the principles of the present disclosure. Therefore, the disclosed example embodiments are used in a generic and descriptive sense only and not for purposes of limitation.

What is claimed is:

1. A non-volatile memory package comprising:
    a first substrate having a first position at which an I/O pad is provided on a lower side of the first substrate, and a second position at which a first buffer chip connected to the I/O pad is provided on an upper side of the first substrate opposing the lower side, wherein the second position of the first substrate is spaced apart from a first edge of the first substrate by an interval, and a placement of the first buffer chip at the second position of the first substrate is configured to maximize a window in an eye diagram for a time-varying signal with respect to the first buffer chip and the I/O pad to which the first buffer chip is connected;
    a second substrate having a same size and a same shape as the first substrate, the second substrate having a second position that is spaced apart from a second edge of the second substrate by the interval;
    a plurality of first non-volatile memory chips placed on the first substrate;
    the first buffer chip provided at the second position of the first substrate and connected to the plurality of first non-volatile memory chips;
    a plurality of second non-volatile memory chips placed on the second substrate, each of the plurality of second non-volatile memory chips having a second size that is different from a first size of each of the plurality of first non-volatile memory chips; and
    a second buffer chip provided at the second position of the second substrate and connected to the plurality of second non-volatile memory chips.

2. The non-volatile memory package of claim 1, wherein the non-volatile memory package further comprises:
    a third buffer chip provided at a third position of the first substrate and connected to the plurality of first non-volatile memory chips; and
    a fourth buffer chip provided at a third position of the second substrate and connected to the plurality of second non-volatile memory chips.

3. The non-volatile memory package of claim 2, wherein the plurality of first non-volatile memory chips comprises a first portion of first non-volatile memory chips and a second portion of first non-volatile memory chips that are stacked in different directions from each other.

4. The non-volatile memory package of claim 2, wherein the plurality of second non-volatile memory chips comprises a first portion of second non-volatile memory chips and a second portion of second non-volatile memory chips that are stacked in different directions from each other.

5. The non-volatile memory package of claim 1, wherein the plurality of second non-volatile memory chips comprises a first portion of second non-volatile memory chips and a second portion of second non-volatile memory chips that are stacked in different directions from each other, and
    wherein the non-volatile memory package further comprises a support which supports at least a part of the plurality of second non-volatile memory chips.

6. The non-volatile memory package of claim 5, wherein the support includes an insulating material.

7. The non-volatile memory package of claim 1, wherein the plurality of first non-volatile memory chips comprises a first portion of first non-volatile memory chips and a second portion of first non-volatile memory chips, and the first portion of first non-volatile memory chips is connected to the first buffer chip through a first wire, and wherein the second portion of first non-volatile memory chips is connected to the first buffer chip through a second wire that is different from the first wire.

8. The non-volatile memory package of claim 1, wherein the second position of the first substrate is located at a first corner of the first substrate and the second position of the second substrate is located at a second corner of the second substrate corresponding to the first corner of the first substrate.

9. A non-volatile memory package comprising:
    a first substrate and a second substrate on which I/O pads are respectively provided based on a ball map on which a position of the I/O pads is indicated;
    a plurality of first non-volatile memory chips provided on the first substrate;
    a first buffer chip provided at a first position on the first substrate and connected to the plurality of first non-volatile memory chips, wherein a placement of the first buffer chip at the first position of the first substrate is configured to maximize a window in an eye diagram for a time-varying signal with respect to the first buffer chip and a first I/O pad to which the first buffer chip is connected, the I/O pads comprising the first I/O pad;
    a plurality of second non-volatile memory chips provided on the second substrate, each of the plurality of second non-volatile memory chips having a second size that is different from a first size of each of the plurality of first non-volatile memory chips; and
    a second buffer chip provided at a second position on the second substrate that corresponds to the first position on the first substrate, the second buffer chip being connected to the plurality of second non-volatile memory chips.

10. The non-volatile memory package of claim 9, further comprising:
    a third buffer chip provided at a third position on the first substrate and connected to the plurality of first non-volatile memory chips; and a fourth buffer chip provided at a fourth position on the second substrate that corresponds to the third position on the first substrate, the fourth buffer chip being connected to the plurality of second non-volatile memory chips.

11. The non-volatile memory package of claim 10, wherein the plurality of first non-volatile memory chips comprises a first portion of first non-volatile memory chips and a second portion of first non-volatile memory chips that are stacked in different directions from each other.

12. The non-volatile memory package of claim 10, wherein the plurality of second non-volatile memory chips comprises a first portion of second non-volatile memory chips and a second portion of second non-volatile memory chips that are stacked in different directions from each other.

13. The non-volatile memory package of claim 9, wherein the plurality of second non-volatile memory chips comprises a first portion of second non-volatile memory chips and a second portion of second non-volatile memory chips that are stacked in different directions from each other, and
wherein the non-volatile memory package further comprises a support which supports at least a part of the plurality of second non-volatile memory chips.

14. The non-volatile memory package of claim 13, wherein the support includes an insulating material.

15. The non-volatile memory package of claim 9, wherein the plurality of first non-volatile memory chips comprises a first portion of first non-volatile memory chips and a second portion of first non-volatile memory chips, and the first portion of first non-volatile memory chips is connected to the first buffer chip through a first wire, and
wherein the second portion of first non-volatile memory chips is connected to the first buffer chip through a second wire that is different from the first wire.

16. The non-volatile memory package of claim 9, wherein the first position on the first substrate is located at a first corner of the first substrate and the second position on the second substrate is located at a second corner of the second substrate corresponding to the first corner of the first substrate.

17. A storage device comprising:
a controller configured to send and receive data through a plurality of channels; and
a plurality of non-volatile memory packages connected to the plurality of channels,
wherein at least a part of the plurality of non-volatile memory packages comprises:
a first substrate having a first position at which a first I/O pad is provided on a lower side of the first substrate, and a second position at which a first buffer chip connected to the first I/O pad is provided on an upper side of the first substrate opposing the lower side of the first substrate, wherein a placement of the first buffer chip at the second position of the first substrate is configured to maximize a window in an eye diagram for a time-varying signal with respect to the first buffer chip and the first I/O pad to which the first buffer chip is connected;
a second substrate having a third position at which a second I/O pad is provided on a lower side of the second substrate and a fourth position at which a second buffer chip connected to the second I/O pad is provided on an upper side of the second substrate opposing the lower side of the second substrate, the first position of the second substrate corresponding to the first position of the first substrate and the second position of the second substrate corresponding to the second position of the first substrate;
a plurality of first non-volatile memory chips provided on the first substrate;
the first buffer chip provided at the second position of the first substrate and connected to the plurality of first non-volatile memory chips;
a plurality of second non-volatile memory chips provided on the second substrate, each of the plurality of second non-volatile memory chips having a second size that different from a first size of each of the plurality of first non-volatile memory chips; and
the second buffer chip provided at the second position of the second substrate and connected to the plurality of second non-volatile memory chips.

18. The storage device of claim 17, wherein the storage device further comprises:
a third buffer chip placed at a third position of the first substrate and connected to the plurality of first non-volatile memory chips; and
a fourth buffer chip placed at a third position of the second substrate and connected to the plurality of second non-volatile memory chips.

19. The storage device of claim 18, wherein the plurality of first non-volatile memory chips comprises a first portion of first non-volatile memory chips and a second portion of first non-volatile memory chips that are stacked in different directions from each other.

20. The storage device of claim 18, wherein the plurality of second non-volatile memory chips comprises a first portion of second non-volatile memory chips and a second portion of second non-volatile memory chips that are stacked in different directions from each other.

* * * * *